United States Patent
Park

(10) Patent No.: US 9,443,586 B2
(45) Date of Patent: Sep. 13, 2016

(54) NONVOLATILE MEMORY DEVICE, MEMORY SYSTEM INCLUDING THE SAME AND METHOD FOR DRIVING NONVOLATILE MEMORY DEVICE

(71) Applicant: Hyun-Kook Park, Anyang-si (KR)

(72) Inventor: Hyun-Kook Park, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/680,496

(22) Filed: Apr. 7, 2015

(65) Prior Publication Data

US 2015/0287455 A1 Oct. 8, 2015

(30) Foreign Application Priority Data

Apr. 7, 2014 (KR) .................. 10-2014-0041289

(51) Int. Cl.
*G11C 11/00* (2006.01)
*G11C 13/00* (2006.01)
*G11C 11/56* (2006.01)

(52) U.S. Cl.
CPC ............. *G11C 13/004* (2013.01); *G11C 11/56* (2013.01); *G11C 11/5614* (2013.01); *G11C 11/5678* (2013.01); *G11C 11/5685* (2013.01); *G11C 2213/71* (2013.01); *G11C 2213/72* (2013.01)

(58) Field of Classification Search
CPC .................. G11C 13/004; G11C 2029/0411; G11C 11/15; G11C 13/0007; G11C 13/0061; G11C 13/0069; G11C 2013/0073; G11C 29/52; G11C 11/404
USPC .......... 365/148, 158, 171, 149, 173, 185.26, 365/187, 189.04, 189.16, 200, 225.5, 72
See application file for complete search history.

(56) References Cited

U.S. PATENT DOCUMENTS

| | | | |
|---|---|---|---|
| 7,679,953 B2 | 3/2010 | Sutardja | |
| 7,830,705 B2 | 11/2010 | Jeong | |
| 8,094,488 B2 | 1/2012 | Lee | |
| 8,159,869 B2 | 4/2012 | Park et al. | |
| 8,355,291 B2 | 1/2013 | Kim et al. | |
| 2006/0034112 A1* | 2/2006 | Oh | G11C 7/06 365/148 |
| 2012/0213005 A1 | 8/2012 | Lee | |
| 2013/0080858 A1 | 3/2013 | Lee et al. | |
| 2013/0107633 A1 | 5/2013 | Kim | |
| 2013/0139036 A1 | 5/2013 | Lee | |
| 2013/0185612 A1 | 7/2013 | Lee et al. | |
| 2013/0272063 A1 | 10/2013 | Bedeschi | |
| 2013/0279243 A1 | 10/2013 | Huang | |

FOREIGN PATENT DOCUMENTS

| | | |
|---|---|---|
| KR | 0944322 | 2/2010 |
| KR | 1224259 | 1/2013 |
| KR | 20130084901 | 7/2013 |

* cited by examiner

*Primary Examiner* — Thong Q Le
(74) *Attorney, Agent, or Firm* — Volentine & Whitt, PLLC

(57) ABSTRACT

A nonvolatile memory device can improve a read retry operation speed while minimizing a reduction in the capability of a memory read operation by performing a read retry operation. The nonvolatile memory device includes a resistive memory cell, a sensing node, and a sense amplifier connected to the sensing node and sensing a difference between a voltage level of the sensing node and a reference voltage level or a difference between a current level of the sensing node and a reference current level. When a read fail bit value is generated during a read operation of data stored in the resistive memory cell, a current flowing in the resistive memory cell is changed by changing a difference between voltages of opposite ends of the resistive memory cell and a read retry operation is then performed.

20 Claims, 29 Drawing Sheets

FIG. 1

| 1_1 | 1_2 | 1_3 | 1_4 | 1_5 | 1_6 | 1_7 | 1_8 |
|---|---|---|---|---|---|---|---|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| SA/WD(2_1) | | SA/WD(2_2) | | SA/WD(2_3) | | SA/WD(2_4) | |
| PERIPHERY(3) | | | | | | | |
| SA/WD(2_8) | | SA/WD(2_7) | | SA/WD(2_6) | | SA/WD(2_5) | |
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 1_16 | 1_15 | 1_14 | 1_13 | 1_12 | 1_11 | 1_10 | 1_9 |

FIG. 17 with 5μA shift

| Time | 100μs | 1μs | 5μs | 10μs |
|---|---|---|---|---|
| Isink or drive | 3.8 μA | 380 μA | 76 μA | 38 μA |

NONVOLATILE MEMORY DEVICE, MEMORY SYSTEM INCLUDING THE SAME AND METHOD FOR DRIVING NONVOLATILE MEMORY DEVICE

CROSS-REFERENCE TO RELATED APPLICATION

This application claims priority from Korean Patent Application No. 10-2014-0041289 filed on Apr. 7, 2014 in the Korean Intellectual Property Office, and all the benefits accruing therefrom under 35 U.S.C. 119, the contents of which in its entirety are herein incorporated by reference.

BACKGROUND

1. Field of the Inventive Concept

The present inventive concept relates to a nonvolatile memory device, a memory system including the same, and a method for driving the nonvolatile memory device.

2. Description of the Related Art

Nonvolatile memory devices using a resistance material include phase change random access memories (PRAMs), resistive RAM (RRAMs), magnetic RAMs (MRAMs), and the like. A dynamic RAM (DRAM) or a flash memory device stores data using charges, whereas a nonvolatile memory device using a resistance material stores data using a phase change of a phase change material such as a chalcogenide alloy (in the case of a PRAM), a resistance change of a variable resistance material (in the case of an ReRAM), a resistance change of a magnetic tunnel junction (MTJ) thin film according to a magnetization state of a ferromagnetic material (in the case of an MRAM), and the like.

More specifically, the phase change material is changed to a crystalline state, or to an amorphous state as it is cooled after being heated. The phase change material in a crystalline state has a low resistance, and the phase change material in an amorphous state has a high resistance. Accordingly, the crystalline state may be defined as set data or "0" data, and the amorphous state may be defined as reset data or "1" data.

SUMMARY

The present inventive concept provides a nonvolatile memory device including a resistive memory, which can improve a read retry operation speed while minimizing a reduction in the capability of a memory read operation by performing a read retry operation.

The present inventive concept also provides a memory system including the nonvolatile memory device.

The present inventive concept also provides a method for driving the nonvolatile memory device including a resistive memory, which can improve a read retry operation speed while minimizing a reduction in the capability of a memory read operation by performing a read retry operation.

These and other aspects of the present inventive concept will be described in or be apparent from the following description of the preferred embodiments.

According to an aspect of the present inventive concept, there is provided a nonvolatile memory device including a resistive memory cell, a sense amplifier connected to the sensing node and sensing a difference between a voltage level of the sensing node and a reference voltage level or a difference between a current level of the sensing node and a reference current level, wherein when a read fail bit value is generated during a read operation of data stored in the resistive memory cell, a current flowing in the resistive memory cell is changed by changing a difference between voltages of opposite ends of the resistive memory cell and a read retry operation is then performed.

According to another aspect of the present inventive concept, there is provided a nonvolatile memory device including a memory cell array including a plurality of resistive memory cells, first to nth sensing nodes connected to the plurality of resistive memory cells, respectively, and sense amplifiers connected to the first to nth sensing nodes and sensing a difference between each of voltage levels of the first to nth sensing nodes and a reference voltage level or a difference between each of current levels of the first to nth sensing nodes and a reference current level, wherein n is a natural number of 2 or greater, when a read fail bit value of greater than or equal to a preset critical value is generated during a read operation of data stored in each of the plurality of resistive memory cells, a current flowing in each of the plurality of resistive memory cells is changed by changing a difference between voltages of opposite ends of each of the plurality of resistive memory cells and a read retry operation is then performed.

According to still another aspect of the present inventive concept, there is provided a memory system comprising a resistive memory device, a core unit positioned inside the resistive memory device and controlling read/write operations to be performed, and a logic unit supplying a read retry operation signal to the core unit, wherein the logic unit supplies the read retry operation signal when a read fail bit value of greater than or equal to a preset critical value is generated during a read operation in a resistive memory cell.

According to a further aspect of the present inventive concept, there is provided a memory system including a resistive memory device, and a memory controller supplying a read retry operation signal to the resistive memory device, wherein the memory controller supplies the read retry operation signal to the resistive memory device when a read fail bit value of greater than or equal to a preset critical value is generated during a read operation in a resistive memory cell.

According to yet another aspect of the present inventive concept, there is provided a method for driving a nonvolatile memory device, the method including sensing whether a read fail bit value of greater than or equal to a preset critical value is generated during a read operation of data stored in each of a plurality of resistive memory cells, and performing a read retry operation when the read fail bit value is greater than or equal to the preset critical value, wherein the read retry operation is performed after changing the current flowing in each of the plurality of resistive memory cells by changing a difference between voltages of opposite ends of each of the plurality of resistive memory cells.

According to a still further aspect of the inventive concept, there is provided a method of operating a nonvolatile memory device having at least one resistive memory cell connected to a sensing node, the method comprising: performing a read operation for reading data of a memory cell by sensing one of: a difference between a voltage level of the sensing node and a reference voltage level; and a difference between a current level of the sensing node and a reference current level; determining whether a read fail bit value is generated during the read operation of the data stored in the resistive memory cell; and when it is determined that a read fail bit value is generated during the read operation of the data stored in the resistive memory cell: changing a current flowing in the resistive memory cell by changing a difference between voltages of opposite ends of the resistive memory cell, and after changing the current flowing in the resistive memory cell by changing the difference between voltages of opposite ends of the resistive memory cell, performing a read retry operation for reading the data of the memory cell by sensing one of: the difference between the voltage level of the sensing node and the reference voltage level; and the difference between the current level of the sensing node and the reference current level.

BRIEF DESCRIPTION OF THE DRAWINGS

The above and other features and advantages of the present inventive concept will become more apparent by describing in detail preferred embodiments thereof with reference to the attached drawings in which:

FIG. 1 is a block diagram illustrating a nonvolatile memory device according to some embodiments of the present inventive concept;

FIG. 17 is a table illustrating examples of currents required in changing a reference current by 5 µA within a predetermined time;

DETAILED DESCRIPTION OF THE EMBODIMENTS

Figure 2:
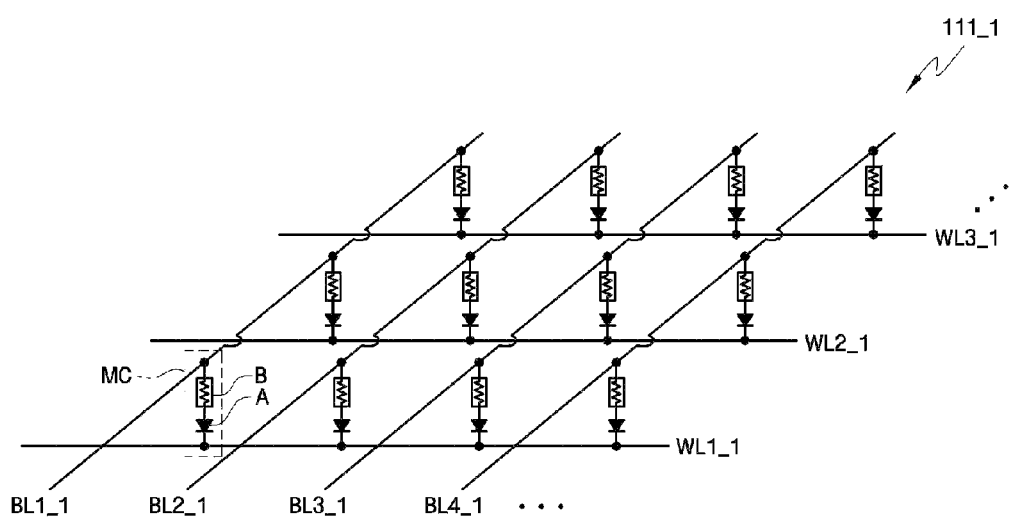
FIG. 2 is a diagram illustrating a memory cell array of the nonvolatile memory device shown in FIG. 1.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The present invention will be described with reference to perspective views, cross-sectional views, and/or plan views, in which preferred embodiments of the invention are shown. Thus, the profile of an exemplary view may be modified according to manufacturing techniques and/or allowances.

That is, the embodiments of the invention are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

Hereinafter, a description will be made of embodiments of the present inventive concept by using phase change random access memory (PRAM) devices. However, it will be apparently understood by those skilled in the art that the present inventive concept can be applied to nonvolatile memory devices using variable resistive elements, such as resistive RAM (ReRAM) devices, magnetic RAM (MRAM) devices, ferroelectric RAM (FRAM) devices, and the like.

FIG. 1 is a block diagram illustrating a nonvolatile memory device according to some embodiments of the present inventive concept. For the sake of convenient explanation, a nonvolatile memory device including 16 memory banks is exemplified in FIG. 1, but aspects of the present inventive concept are not limited thereto.

Referring to FIG. 1, the nonvolatile memory device according to some embodiments of the present inventive concept includes a memory cell array, a plurality of sense amplifiers and write drivers SA/WD 2_1 to SA/WD 2_8, and a peripheral circuit area 3.

The memory cell array may include a plurality of memory banks 1_1 to 1_16, each of the memory banks 1_1 to 1_16 may include a plurality of memory blocks BLK0 to BLK7, and each of the memory blocks BLK0 to BLK7 may include a plurality of nonvolatile memory cells arranged in a matrix configuration. Each memory bank 1_1 to 1_16 is exemplified in FIG. 1 as having 8 memory blocks BLK0 to BLK7, but aspects of the present inventive concept are not limited thereto.

In addition, although not specifically shown, a row select circuit and a column select circuit are arranged to correspond to the memory banks 1_1 to 1_16 to designate a row and a column of a resistive memory cell to write/read data.

The sense amplifiers and write drivers SA/WD 2_1 to SA/WD 2_8 are arranged to correspond to two rows of the memory banks 1_1 to 1_16 to perform read and write operations for the corresponding memory banks 1_1 to 1_16.

As exemplified in FIG. 1, each of the sense amplifiers and write drivers 2_1 to 2_8 correspond to two rows of the memory banks 1_1 to 1_16, but aspects of the present inventive concept are not limited thereto. That is to say, the sense amplifiers and write drivers SA/WD 2_1 to SA/WD 2_8 may be arranged to correspond to one row, or four rows, of memory banks.

A plurality of logic circuit blocks for driving the column select circuit, the row select circuits, the sense amplifiers and write drivers SA/WD 2_1 to SA/WD 2_8, a voltage generator, and so on, may be arranged in the peripheral circuit area 3.

Figure 3:
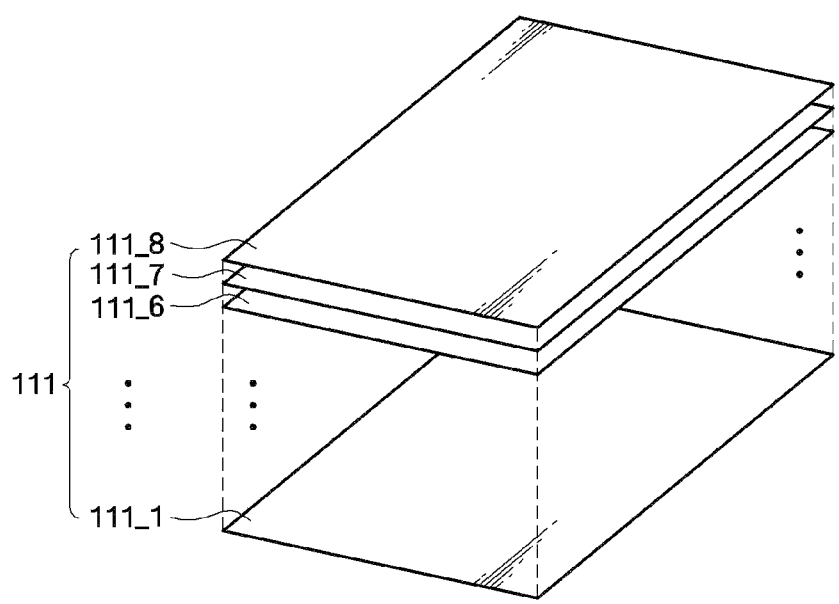
FIG. 3 is a perspective of memory banks of the nonvolatile memory device of FIG. 1.

FIGS. 2 and 3 are diagrams illustrating a memory cell array shown in FIG. 1.

Referring to FIG. 2, the memory cell may have a cross point structure. The cross point structure means a structure in which a memory cell is formed at an intersection of one line and another line in a memory cell layer 111_1.

For example, bit lines BL1_1 to BL4_1 extend in a first direction, the word lines WL1_1 to WL3_1 extend in a second direction so as to cross the bit lines BL1_1 to BL4_1, and resistive memory cells MCs may be formed at intersections of the respective bit lines BL1_1 to BL4_1 and the respective WL1_1 to WL3_1.

Alternatively, shown in FIG. 3, each memory bank may have a three-dimensional (3D) stacked structure. The 3D stacked structure may mean a structure in which the plurality of memory cell layers 111_1 to 111_8 are vertically stacked.

In FIG. 3, for example, eight (8) memory cell layers 111_1 to 111_8 are stacked, but aspects of the present inventive concept are not limited thereto. Here, each of the memory cell layers 111_1 to 111_8 may include a plurality of memory cell groups and/or a plurality of redundant memory cell groups. If a memory cell array has a 3D stacked structure, each of the memory cell layers 111_1 to 111_8 may have a cross point structure shown in FIG. 2, but aspects of the present inventive concept are not limited thereto.

Figure 4:
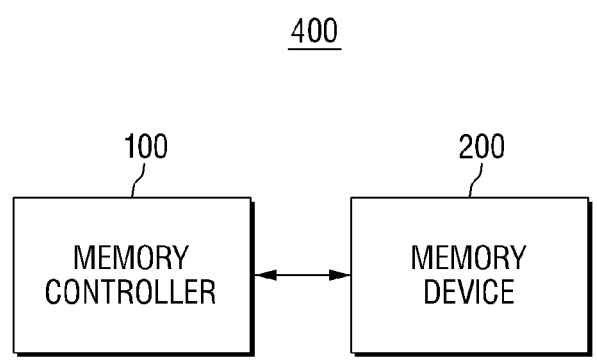
FIG. 4 is a block diagram illustrating a memory system according to an embodiment of the present inventive concept.

FIG. 4 is a block diagram of a memory system 400 according to an embodiment of the present inventive concept.

Referring to FIG. 4, memory system 400 according to an embodiment of the present inventive concept includes a memory controller 100 and a memory device 200.

Memory controller 100 is configured to control memory device 200 in response to a request from a host (not shown). For example, memory controller 100 may be configured to control write, read and erase operations of memory device 200. Memory controller 100 is configured to drive firmware for controlling memory device 200.

Specifically, when a read fail bit value of greater than or equal to a preset critical value is generated during a read operation of memory device 200, memory controller 100 may supply a read retry operation signal to memory device 200 to allow memory device 200 to perform a read retry operation.

Memory device 200, including a plurality of memory cells, is configured to store data. Memory device 200 may be a nonvolatile memory device. A portion of memory device 200 may have a structure such as that illustrated above with respect to FIG. 1 and/or FIG. 2 and/or FIG. 3.

Figure 5:
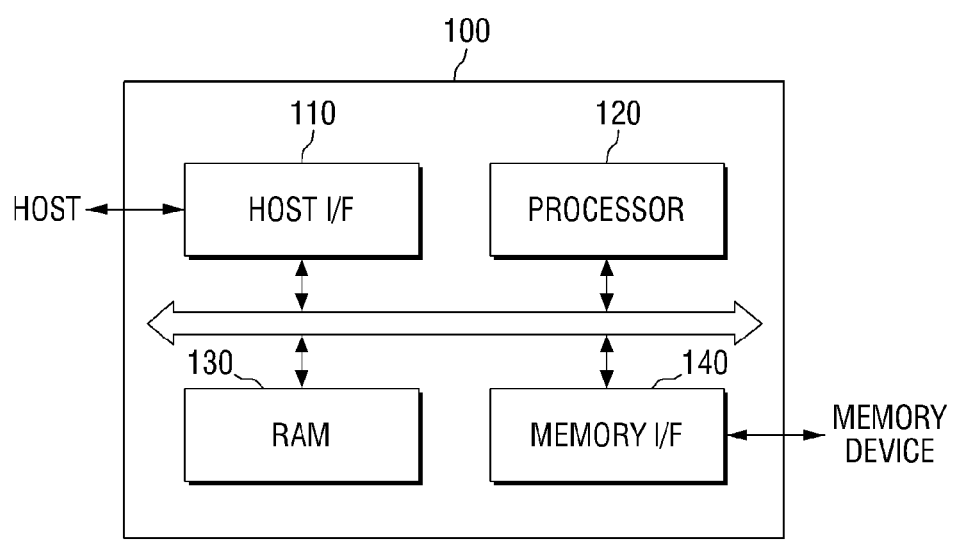
FIG. 5 is a block diagram specifically illustrating a memory controller shown in FIG. 4.

FIG. 5 is a block diagram specifically illustrating memory controller 100 shown in FIG. 4.

Referring to FIG. 5, memory controller 100 includes a host interface (I/F) 110, a processor 120, a buffer memory 130, and a memory I/F 140.

Host interface 110 may be configured to interface with a host. For example, host interface 110 may be configured to support at least one of various standardized interface protocols such as Universal Serial Bus (USB), Multimedia Card (MMC), Peripheral Component Interconnection (PCI), PCI-Express (PCI-E), Advanced Technology Attachment (ATA, Parallel-ATA, pATA), Serial-ATA (SATA), Small Computer Small Interface (SCSI), Enhanced Small Disk Interface (ESDI), and Integrated Drive Electronics (IDE).

Processor 120 may be configured to control the overall operation of memory controller 100.

Buffer memory 130 may receive data to be programmed to memory device 200 from the host, and may temporarily store the received data. During a programming operation of memory device 200, the data temporarily stored in buffer memory 130 may be transmitted to memory device 200 to then be programmed thereto.

Buffer memory 130 also may receive data received from memory device 200 and may temporarily store the received data. For example, buffer memory 130 may be a static RAM (SRAM), but aspects of the present inventive concept are not limited thereto.

Memory I/F 140 may be configured to interface with memory device 200. For example, memory I/F 140 may be configured to include NAND interface protocols, but aspects of the present inventive concept are not limited thereto.

Although not clearly shown in FIG. 5, memory controller 100 may further include an error correction block. The error correction block may be configured to detect errors of the data read from memory device 200 using an error correcting code (ECC), and to correct the detected errors.

The error correction block may be provided as a component of memory controller 100. Alternatively, the error correction block may also be provided as a component of memory device 200.

Figure 6:
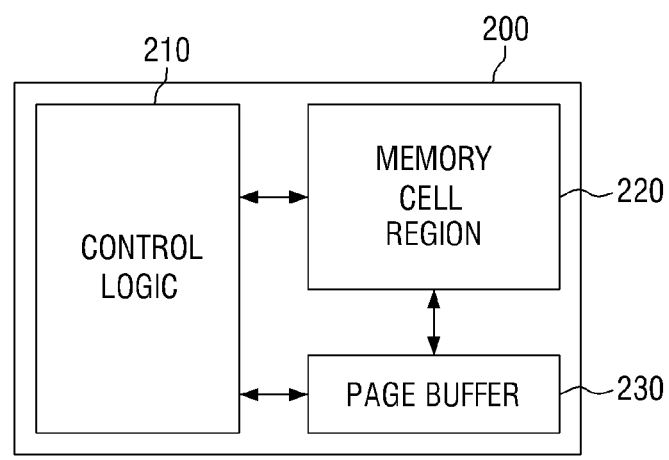
FIG. 6 is a block diagram specifically illustrating a memory device shown in FIG. 4.

FIG. 6 is a block diagram specifically illustrating memory device 200 shown in FIG. 4.

Referring to FIG. 6, memory device 200 includes control logic 210, a memory cell region 220, and a page buffer 230.

Control logic 210 may be configured to control the overall operation of memory device 200.

Memory cell region 220 is provided as a data storage space. In some embodiments of the present inventive concept, memory cell region 220 may be a phase change random access memory (PRAM) or phase change random memory (PCM), a resistive RAM (RRAM), a magnetic RAM (MRAM), and the like.

Page buffer 230 may write data to memory cell region 220 or may read data from memory cell region 220 in response to a request from control logic 210.

During a programming operation of memory device 200, page buffer 230 may temporarily store page data to be written to memory cell region 220. Alternatively, during a read operation of memory device 200, page buffer 230 may temporarily store page data to be read from memory cell region 220.

In some embodiments of the present inventive concept, the data stored in page buffer 230 may have a size enough to be compatible with a NAND flash memory device. For example, a unit size of data stored in page buffer 230 may be 4 KB.

Hereinafter, the operation of memory device 200 according to some embodiments of the present inventive concept will be described.

In one or more aspects, the present inventive concept is directed to a method for performing a read retry operation to compensate for a change in the resistance distribution of a memory cell, which occurs after a passage of time after a write operation in a resistive memory device.

In addition, one or more aspects of the present inventive concept are directed to a method for changing a reference voltage level or a reference current level to minimize a loss in the read operation speed while performing a read retry operation in a resistive memory device.

Figure 7:
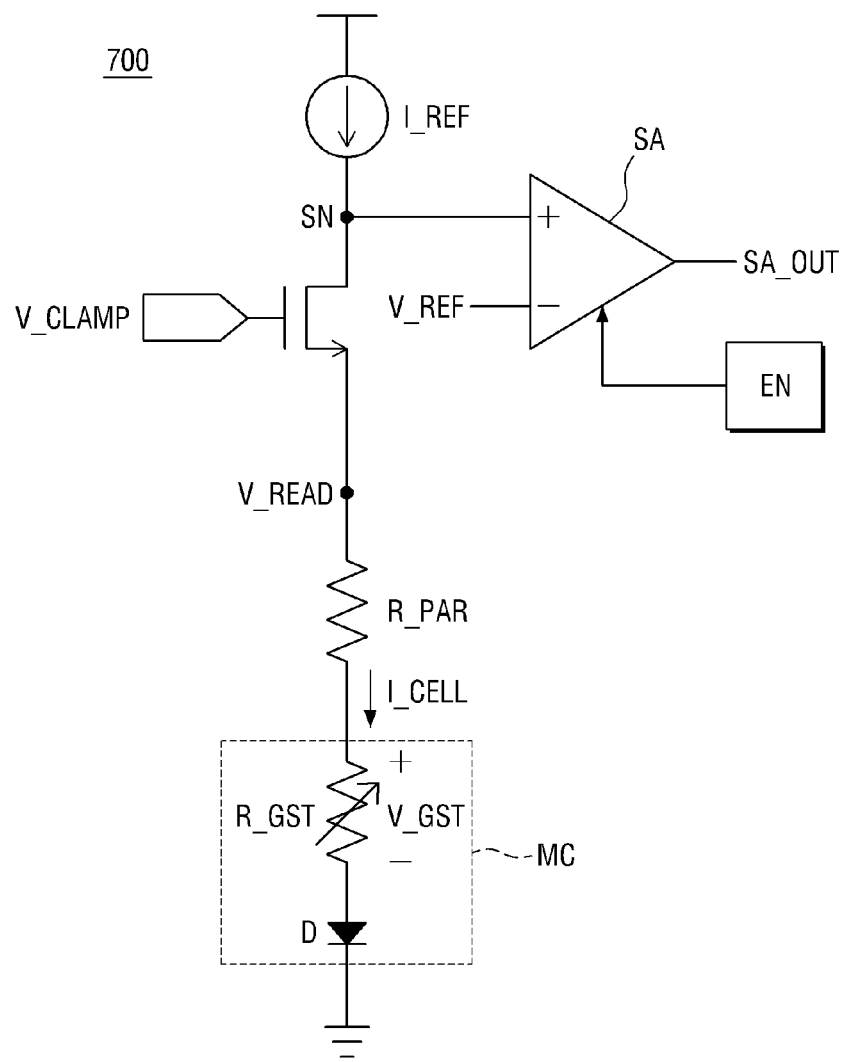
FIG. 7 is an exemplary circuit diagram of a nonvolatile memory device according to a first embodiment of the present inventive concept.

FIG. 7 is an exemplary circuit diagram of a nonvolatile memory device 700 according to a first embodiment of the present inventive concept.

Referring to FIG. 7, nonvolatile memory device 700 according to the first embodiment of the present inventive concept includes a resistive memory cell MC, a clamping unit V_CLAMP, a sensing node SN, a sense amplifier SA, and an enable signal generating unit EN.

The resistive memory cell MC may include a resistive RAM (ReRAM), a magnetic RAM (MRAM), a ferroelectric RAM (FRAM), and the like.

The resistive memory cell MC shown in FIG. 7 is selected among a plurality of resistive memory cells in a memory cell array. Here, when the resistive memory cell MC is a PRAM cell, the nonvolatile memory cell may include a variable resistive element R_GST that contains a phase change material and an access element D that controls a current flowing through the variable resistive element R_GST.

The access element D may be a diode (as shown in FIG. 7), or a transistor connected in series to the variable resistive element RGST.

In addition, examples of the phase change materials may include various kinds of materials, such as GaSb, InSb, InSe, $Sb_2Te_3$, and GeTe in which two elements are chemically combined with each other, GeSbTe, GaSeTe, InSbTe, $SnSb_2Te_4$, and InSbGe in which three elements are chemically combined with one another, and AginSbTe, (GeSn)SbTe, GeSb(SeTe), and $Te_{81}Ge_{15}Sb_2S_2$ in which four elements are chemically combined with one another. Among them, GeSbTe that contains germanium (Ge), antimony (Sb), and tellurium (Te) is mainly used as the phase change material.

Meanwhile, when a nonvolatile memory cell is an RRAM cell, the variable resistive element R_GST may include, for example, NiO or perovskite. Perovskite may be a composition, such as manganite (for example, $Pr_{0.7}Ca_{0.3}MnO_3$, $Pr_{0.5}Ca_{0.5}MnO_3$, PCMO, or LCMO), titanate (for example, STO:Cr), zirconate (for example, SZO:Cr, $Ca_2Nb_2O_7$:Cr or $Ta_2O_5$:Cr), or the like.

In particular, a filament is formed in the variable resistive element R_GST, and the filament serves as a current path of a cell current I_CELL that flows through the resistive memory cell MC.

The clamping unit V_CLAMP is connected between the resistive memory cell MC and the sensing node SN and supplies a clamping bias to the resistive memory cell MC.

The clamping unit V_CLAMP clamps a level of a bit line to be in an appropriate range to read the level of the bit line. In detail, the clamping unit V_CLAMP clamps the bit line level to a predetermined level which is less than or equal to a threshold voltage Vth of a phase change material. If the bit line level exceeds the threshold voltage Vth of the phase change material, a phase of the phase change material of a selected resistive memory cell MC may be changed.

The sense amplifier SA is connected to the sensing node SN and senses a level change of the sensing node SN. The sense amplifier SA senses a difference between a voltage level of the sensing node SN and a reference voltage level V_REF, or a difference between a current level of the sensing node SN and a reference current level I_REF.

In detail, the sense amplifier SA compares the voltage level or the current level of the sensing node SN with the reference voltage level V_REF or the reference current level I_REF and outputs a comparison result. Therefore, the sense amplifier SA may be a current sense amplifier or a voltage sense amplifier. FIG. 7 illustrates an example where the sense amplifier SA is a voltage sense amplifier.

The enable signal generating unit EN may generate an enable signal S_EN activated multiple times during a read operation period to control the sense amplifier SA.

Nonvolatile memory device 700 according to the first embodiment of the present inventive concept determines the data stored in the resistive memory cell MC using a reference voltage V_READ of a read operation, and the reference voltage level V_REF or the reference current level I_REF.

That is to say, when a read fail is generated during a read operation of the data stored in the resistive memory cell MC (that is, when a read fail bit value greater than or equal to a preset critical value is generated), nonvolatile memory device 700 according to the first embodiment of the present inventive concept performs a read retry operation by changing the current I_CELL flowing in the resistive memory cell MC by changing a difference between voltages of opposite ends of the resistive memory cell MC.

Here, nonvolatile memory device 700 according to the first embodiment of the present inventive concept changes the difference between the voltages of the opposite ends of the resistive memory cell MC by changing the clamping bias supplied from the clamping unit V_CLAMP to the resistive memory cell MC.

As described above, the read retry operation is necessarily performed because the cell resistance distribution of the data stored in a memory device is changed with the lapse of a predetermined time after a write operation is performed. That is to say, in order to compensate for the change in the cell resistance distribution of the data stored in a memory device, it is necessary to perform the read retry operation.

In particular, a resistive memory device is advantageous in that it demonstrates a high read operation speed. In order to apply the read retry operation to the resistive memory device, it is necessary to change the reference voltage level V_REF or the reference current level I_REF for differentiating a resistance distribution of a cell from that of another cell in the resistive memory device during a read operation. In this case, in order to maintain a high read operation speed, a large amount of current is continuously consumed in changing the reference voltage level V_REF or the reference current level I_REF.

In order to minimize current consumption during a read retry operation, nonvolatile memory device 700 according to the first embodiment of the present inventive concept may be made into logic such that the reference voltage level V_REF or the reference current level I_REF is changed in a SET direction or a RESET direction for multiple cases in which resistance distributions of a cell are changed.

If the reference voltage level V_REF or the reference current level I_REF is changed in the SET direction or the RESET direction, an initial reference voltage level V_REF or an initial reference current level I_REF can be restored by changing the reference voltage level V_REF or the reference current level I_REF again in the RESET direction or the SET direction.

The multiple cases in which resistance distributions of a cell are changed will be described with reference to FIGS. 8 to 16. Nonvolatile memory device 700 according to the first embodiment of the present inventive concept shifts the reference voltage level V_REF or the reference current level I_REF in the SET direction or the RESET direction, thereby performing a read retry operation for the multiple cases in which resistance distributions of a cell are changed.

FIGS. 8 to 16 are graphs illustrating changes in the resistance distributions of a cell in a resistive memory device.

Specifically, FIGS. 8 to 16 illustrate changes in the resistance distributions of a cell in a case of a PRAM.

Figure 8:
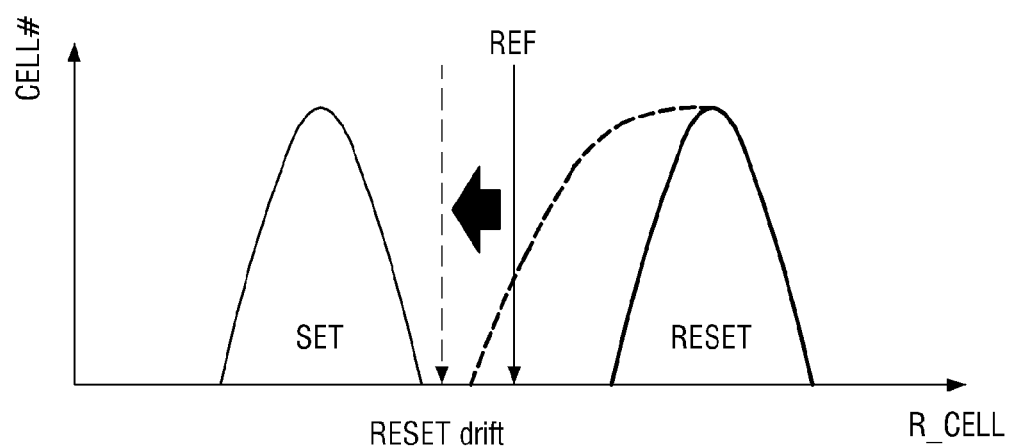
FIGS. 8 to 16 are graphs illustrating changes in the resistance distributions of a cell in a resistive memory device.

Referring to FIG. 8, a RESET drift of a PRAM is illustrated, and immediately after a write operation is finished, resistance of a cell in a RESET state increases, so that the resistance distribution of a cell in the RESET state is fast shifted in a SET direction. Therefore, a read operation performed on the memory device immediately after the write operation is finished should be retried, which is called a read retry operation, and the read retry operation is performed by shifting the reference voltage level V_REF or the reference current level I_REF in the SET direction.

Figure 9:
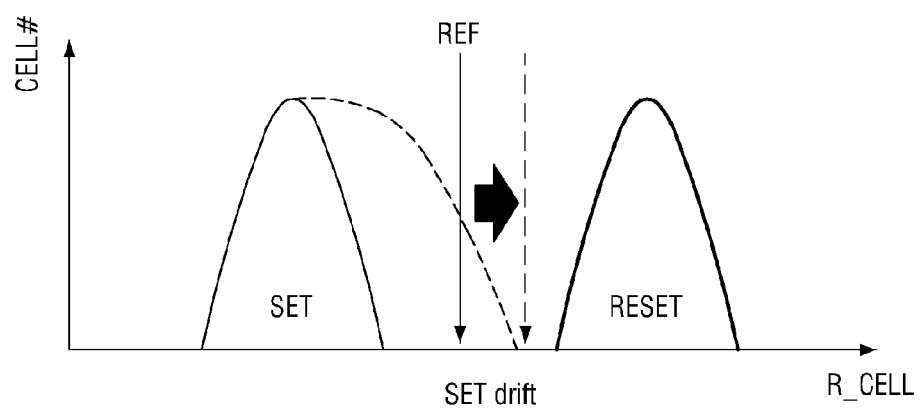

Referring to FIG. 9, a SET drift of a PRAM is illustrated, and after a write operation is finished and a predetermined time is elapsed, resistance of a cell in a SET state increases, so that the resistance distribution of a cell in the SET state is fast shifted in the RESET direction. Therefore, a read operation performed on the memory device after the write operation is finished and the predetermined time is elapsed should be retried, and the read retry operation is performed by shifting the reference voltage level V_REF or the reference current level I_REF in the RESET direction.

Figure 10:
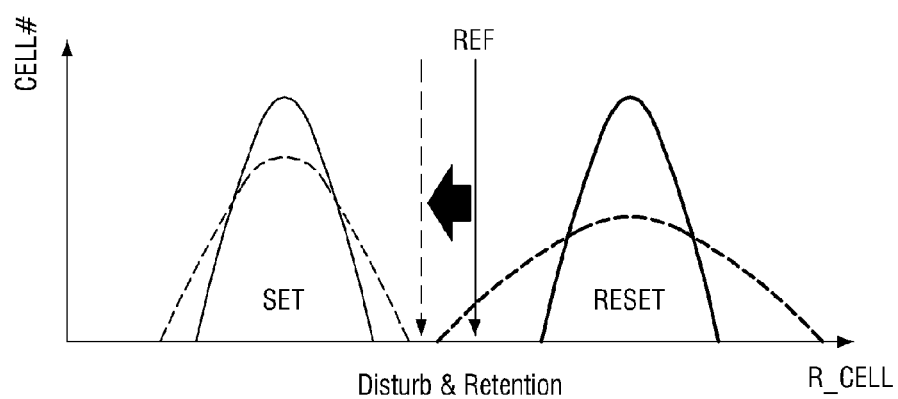

Referring to FIG. 10, changes in the external circumstances, such as disturbance and retention of a PRAM, are illustrated, and resistance values of cells of SET and RESET states become more broadly distributed. In this case, a read retry operation is performed by shifting the reference voltage level V_REF or the reference current level I_REF in the SET direction.

Figure 11:
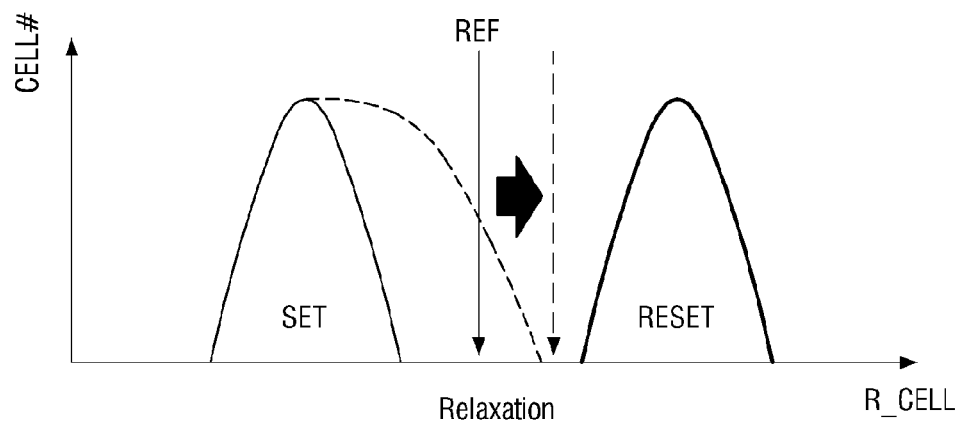
Figure 12:
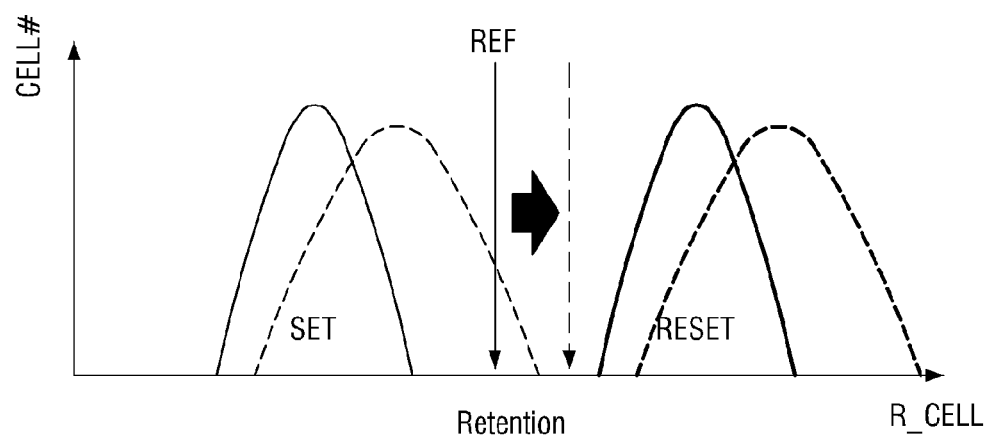
Figure 13:
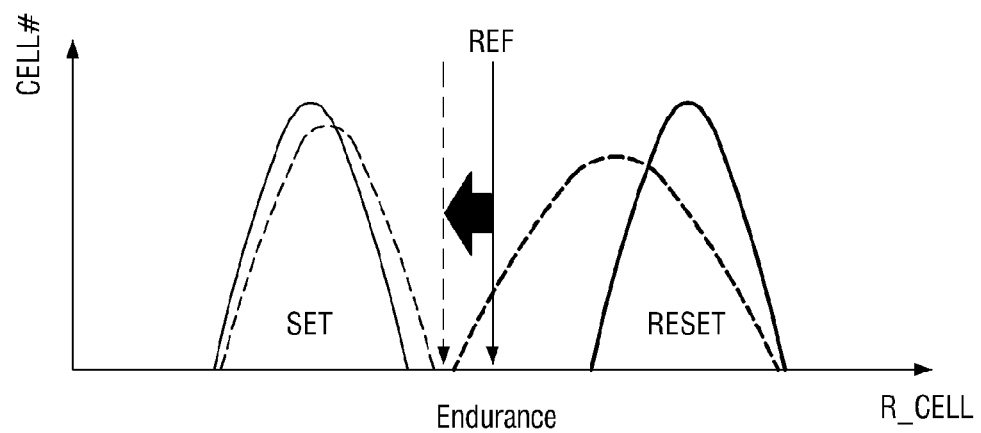

FIGS. 11 to 13 illustrate changes in the resistance distributions of a cell in a case of a ReRAM.

Referring to FIG. 11, relaxation of a ReRAM is illustrated, and after a write operation is finished and a predetermined time is elapsed, resistance of a cell in a SET state increases, so that the resistance distribution of a cell in the SET state is fast shifted in a RESET direction. Therefore, a read operation performed on the memory device after the write operation is finished and the predetermined time is elapsed should be retried, and the read retry operation is performed by shifting the reference voltage level V_REF or the reference current level I_REF in the RESET direction.

Referring to FIG. 12, retention of a ReRAM is illustrated, and with the lapse of time after a write operation is finished, both resistance values of cells in SET and RESET states increase, so that the resistance distributions of cells in the SET and RESET states are both fast shifted in the right direction. Therefore, a read operation performed on the memory device after the write operation is finished and the predetermined time is elapsed should be retried, and the read retry operation is performed by shifting the reference voltage level V_REF or the reference current level I_REF in the direction in which the cell is changed from the SET state to the RESET state (that is, in the right direction in FIG. 12).

Referring to FIG. 13, endurance of a ReRAM is illustrated, and as write operations are repeated, the endurance of the ReRAM is reduced and resistance values of cells in SET and RESET states are both changed, so that a resistance distribution of a cell in the SET state is shifted in the RESET direction and a resistance distribution of a cell in the RESET state is shifted in the SET direction. Therefore, a read operation performed on the memory device after the write operation is finished and a predetermined time is elapsed should be retried. Here, since the resistance distribution of a cell in the RESET state is shifted faster than resistance distribution of a cell in the SET state, the read retry operation is performed by shifting the reference voltage level V_REF or the reference current level I_REF in the SET direction.

Figure 14:
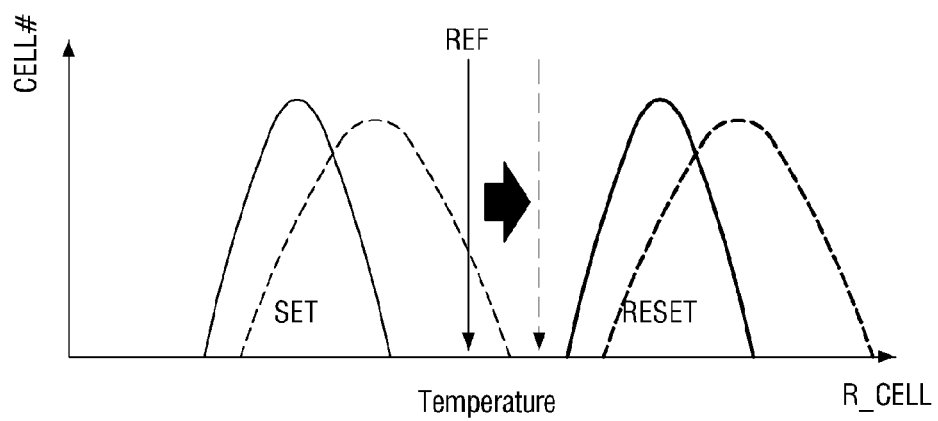
Figure 15:
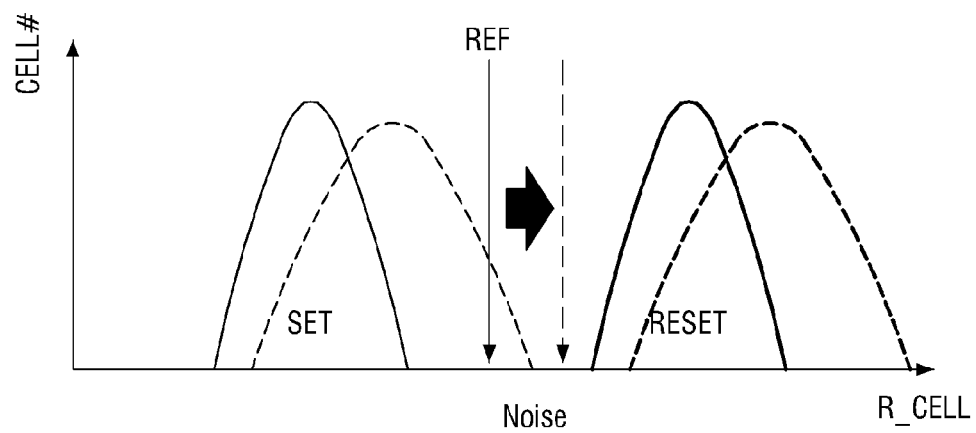
Figure 16:
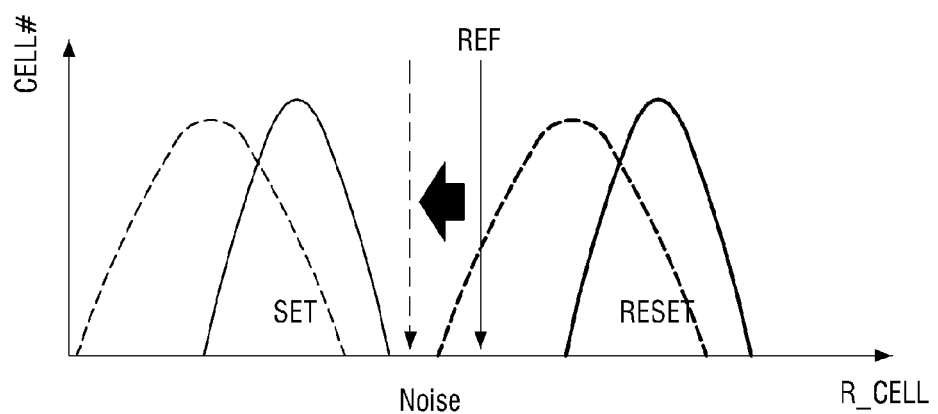

FIGS. 14 to 16 are graphs illustrating changes in the resistance distributions of cells in both cases of a PRAM and a ReRAM.

Referring to FIG. 14, the effect of temperature on a memory device is illustrated, and as the temperature of the memory device is lowered, resistance values of cells in SET and RESET states both increase, so that resistance distributions of cells in the SET and RESET states are both shifted in the right direction. Therefore, a read operation performed on the memory device when the temperature of the memory device is lowered should be retried, and the read retry operation is performed by shifting the reference voltage level V_REF or the reference current level I_REF in the direction in which the cell is changed from the SET state to the RESET state (that is, in the right direction in FIG. 14).

Referring to FIG. 15, the effect of noise is illustrated, and resistance distributions of cells in SET and RESET states are both shifted in the right direction due to the noise. In this case, a read operation performed on a memory device should be retried, and the read retry operation is performed by shifting the reference voltage level V_REF or the reference current level I_REF in the direction in which the cell is changed from the SET state to the RESET state (that is, in the right direction in FIG. 15).

Referring to FIG. 16, a change in the resistance distribution of another cell due to noise in the bias or power voltage is illustrated and resistance distributions of cells in the SET and RESET states are both shifted in the left direction due to the noise in the bias or power voltage. In this case, a read operation performed on a memory device should be retried, and the read retry operation is performed by shifting the reference voltage level V_REF or the reference current level I_REF in the direction in which the cell is changed from the RESET state to the SET state (that is, in the left direction in FIG. 16).

In the above-described cases, the method of performing the read retry operation on the PRAM or the ReRAM may vary according to the change in the cell resistance distributions.

In detail, the method of performing the read retry operation will further be described with regard to a case where a RESET drift is generated in a PRAM.

Figure 18:
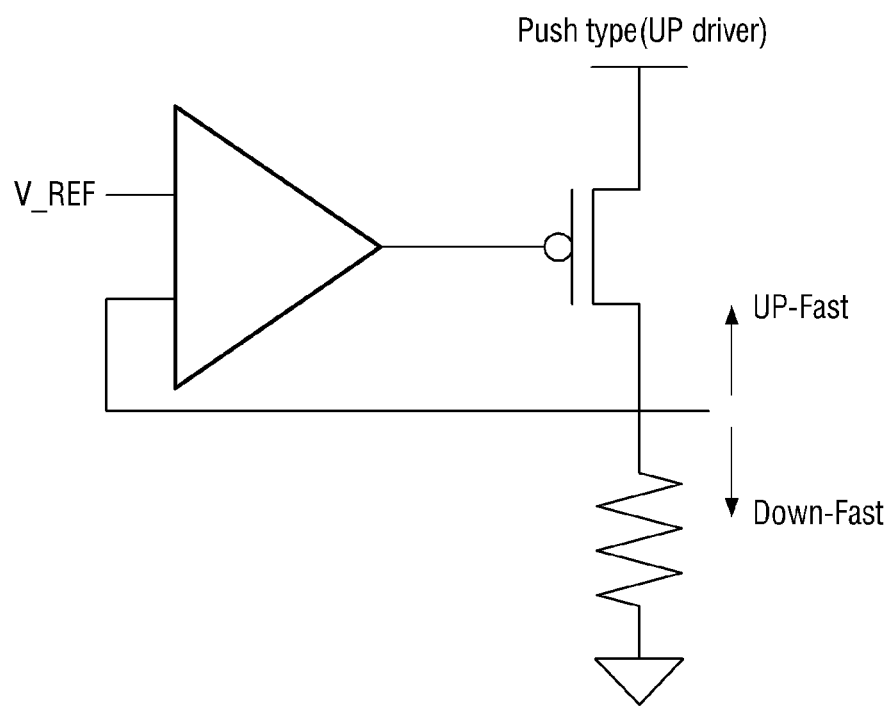
FIG. 18 is an exemplary circuit diagram of a general voltage transmitting circuit fast operating in an upward direction.
Figure 19:
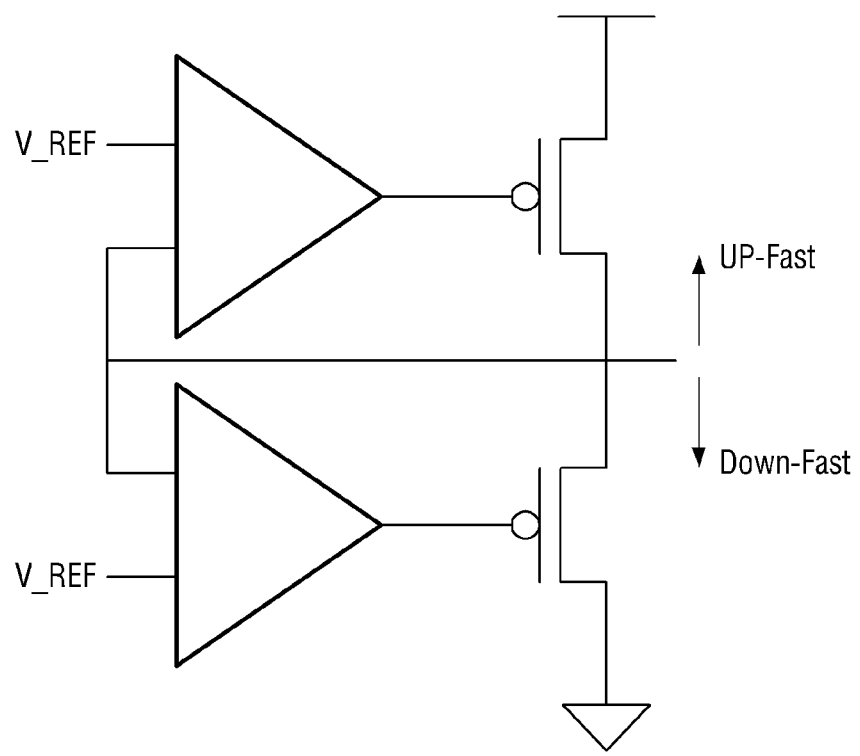
FIG. 19 is an exemplary circuit diagram of a voltage transmitting circuit fast operating in upward and downward directions.
Figure 20:
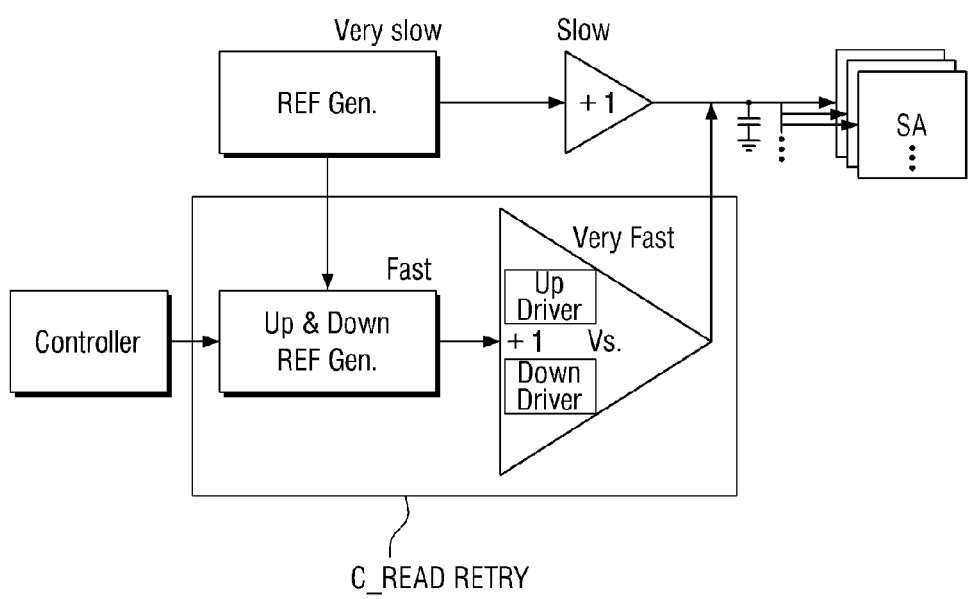
FIG. 20 is a conceptual block diagram of a circuit for generating and transmitting a reference voltage or reference current according to an embodiment of the present inventive concept.

FIG. 17 is a table illustrating examples of currents required in changing a reference current by 5 µA within a predetermined time, FIG. 18 is an exemplary circuit diagram of a general voltage transmitting circuit fast operating in an upward direction, FIG. 19 is an exemplary circuit diagram of a voltage transmitting circuit fast operating in upward and downward directions, and FIG. 20 is a conceptual block diagram of a circuit for generating and transmitting a reference voltage or reference current according to an embodiment of the present inventive concept.

Referring to FIG. 17, in order to maintain a high read operation speed in a resistive memory device, a large amount of current is consumed in changing the reference voltage level V_REF or the reference current level I_REF for performing a read retry operation.

In a case of using the voltage transmitting circuit shown in FIG. 18, current values shown in FIG. 17 are always consumed. In a case of using the voltage transmitting circuit shown in FIG. 19, there may be a problem in the stability of a circuit.

Therefore, as shown in FIG. 20, a fast read retry operation can be achieved by providing a reference voltage (or reference current) generator operating fast to perform a read retry operation, receiving or generating a signal indicating the shift direction of a cell resistance distribution, and selectively driving an UP transmitting circuit or a DOWN transmitting circuit of a reference voltage (or reference current).

Hereinafter, nonvolatile memory devices according to other embodiments of the present inventive concept will be described.

Figure 21:
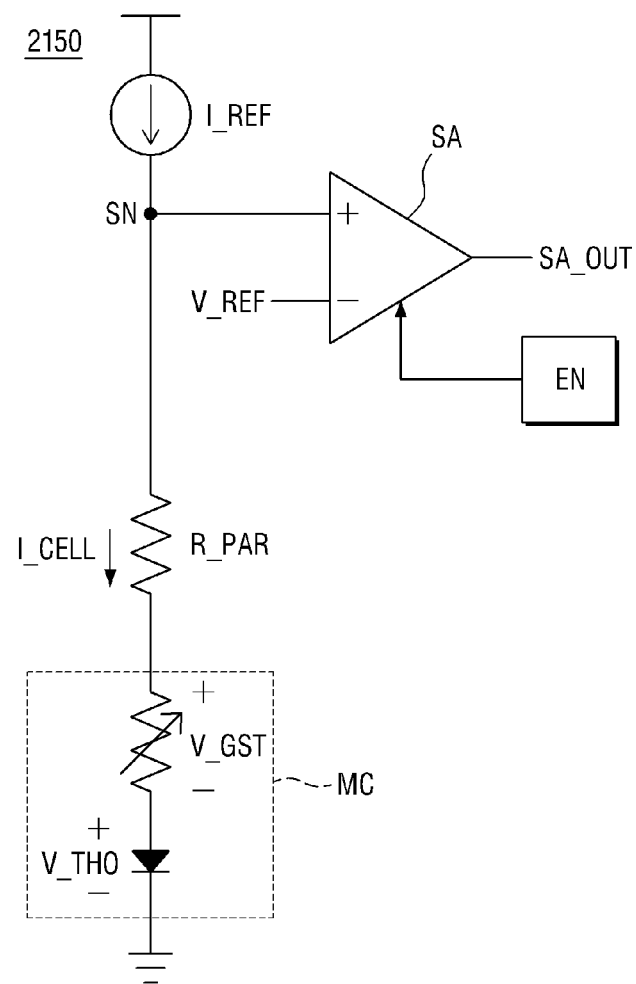
FIG. 21 is an exemplary circuit diagram of a nonvolatile memory device according to a second embodiment of the present inventive concept.

FIG. 21 is an exemplary circuit diagram of a nonvolatile memory device 2150 according to a second embodiment of the present inventive concept. For the sake of convenient explanation, substantially the same content as that of nonvolatile memory device 700 according to the first embodiment will not be given.

Referring to FIG. 21, nonvolatile memory device 2150 according to the second embodiment of the present inventive concept includes a resistive memory cell MC, a sensing node SN, a sense amplifier SA, and an enable signal generating unit EN.

Descriptions of the resistive memory cell MC, the sensing node SN, the sense amplifier SA and the enable signal generating unit EN are substantially the same with those given in the previous embodiment.

Therefore, the following description of nonvolatile memory device 2150 according to the second embodiment of the present inventive concept will focus on a method of performing a read retry operation.

Nonvolatile memory device 2150 according to the second embodiment of the present inventive concept may perform a read retry operation by fixing a current I_CELL flowing in the resistive memory cell MC by fixing voltages of opposite ends of the resistive memory cell MC when a read fail is generated during a read operation of data stored in the resistive memory cell MC (that is, when a read fail bit value of greater than or equal to a preset critical value is generated), and changing a reference current level I_REF.

Alternatively, nonvolatile memory device 2150 according to the second embodiment of the present inventive concept may perform a read retry operation after changing the voltages of the opposite ends of the resistive memory cell MC by changing the current I_CELL flowing in the resistive memory cell MC when a read fail is generated during a read operation of data stored in the resistive memory cell MC (that is, when a read fail bit value of greater than or equal to a preset critical value is generated).

Figure 22:
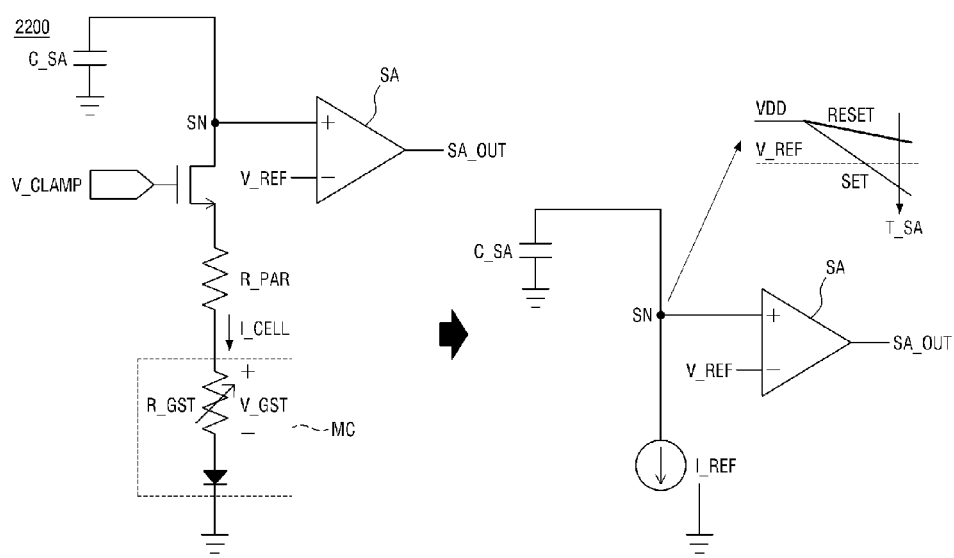
FIG. 22 is an exemplary circuit diagram of a nonvolatile memory device according to a third embodiment of the present inventive concept.

FIG. 22 is an exemplary circuit diagram of a nonvolatile memory device 2200 according to a third embodiment of the present inventive concept. For the sake of convenient explanation, substantially the same content as that of nonvolatile memory device 700 according to the first embodiment will not be given.

Referring to FIG. 22, nonvolatile memory device 2200 according to the third embodiment of the present inventive concept includes a resistive memory cell MC, a clamping unit V_CLAMP, a sensing node SN, a sense amplifier SA, an enable signal generating unit EN, and a capacitor C_SA.

Descriptions of the resistive memory cell MC, the clamping unit V_CLAMP, the sensing node SN, the sense amplifier SA and the enable signal generating unit EN are substantially the same with those given in the previous embodiment.

Nonvolatile memory device 2200 according to the third embodiment of the present inventive concept includes the capacitor C_SA. The capacitor C_SA is connected to the sensing node SN to then be connected to the sense amplifier SA.

The following description of nonvolatile memory device 2200 according to the third embodiment of the present inventive concept will focus on a method of performing a read retry operation.

When a read fail bit value is generated (that is, when a read fail bit value of greater than or equal to a preset critical value is generated) during a read operation of data stored in the resistive memory cell MC, nonvolatile memory device 2200 according to the third embodiment of the present inventive concept may perform a read retry operation by fixing a current I_CELL flowing in the resistive memory cell MC by fixing voltages of opposite ends of the resistive memory cell and changing the capacitance of the capacitor C_SA.

Alternatively, when a read fail bit value is generated (that is, when a read fail bit value of greater than or equal to a preset critical value is generated) during a read operation of data stored in the resistive memory cell MC, nonvolatile memory device 2200 according to the third embodiment of the present inventive concept may perform a read retry operation by fixing the current I_CELL flowing in the resistive memory cell MC by fixing the voltages of the opposite ends of the resistive memory cell MC and changing a reference voltage level V_REF.

Alternatively, when a read fail bit value is generated (that is, when a read fail bit value of greater than or equal to a preset critical value is generated) during a read operation of data stored in the resistive memory cell MC, nonvolatile memory device 2200 according to the third embodiment of the present inventive concept may perform a read retry operation by fixing the current I_CELL flowing in the resistive memory cell MC by fixing the voltages of the opposite ends of the resistive memory cell MC and changing a sensing time T_SA from a starting time point of discharging the capacitor C_SA to a time point of reading the data stored in the resistive memory cell MC.

Alternatively, when a read fail bit value is generated (that is, when a read fail bit value of greater than or equal to a preset critical value is generated) during a read operation of data stored in the resistive memory cell MC, nonvolatile memory device 2200 according to the third embodiment of the present inventive concept may perform a read retry operation after changing the current I_CELL flowing in the resistive memory cell MC by changing the difference between the voltages of the opposite ends of the resistive memory cell MC. In particular, nonvolatile memory device 2200 according to the third embodiment of the present inventive concept may change the difference between the voltages of the opposite ends of the resistive memory cell MC by changing a clamping bias supplied from the clamping unit V_CLAMP to the resistive memory cell MC.

Figure 23:
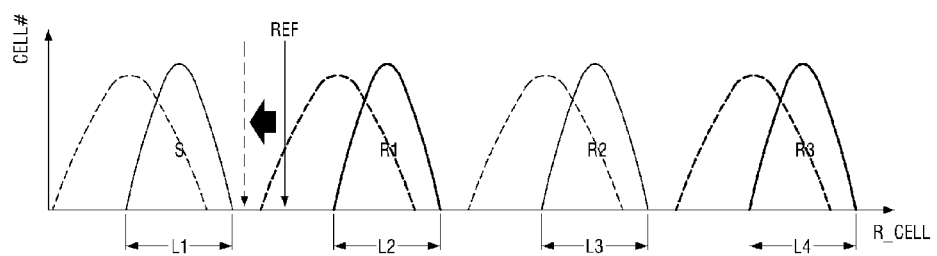
FIG. 23 is a graph illustrating an exemplary resistance distribution of a cell in a nonvolatile memory device according to a fourth embodiment of the present inventive concept.

FIG. 23 is a graph illustrating an exemplary resistance distribution of a cell in a nonvolatile memory device according to a fourth embodiment of the present inventive concept. For the sake of convenient explanation, substantially the same content as that of nonvolatile memory device 700 according to the first embodiment will not be given.

Referring to FIG. 23, a nonvolatile memory device according to the fourth embodiment of the present inventive concept may include a multi-bit cell as a resistive memory cell MC. The resistive memory cell MC may store one of first data to fourth data S, R1, R2 and R3. FIG. 23 illustrates an exemplary case in which resistance distributions of cells in the SET and RESET states are both shifted in the left direction due to noise in the bias or power line.

The first to fourth data S, R1, R2 and R3 may correspond to first to fourth resistance levels L1, L2, L3 and L4, respectively. The resistance values may increase sequentially from the first to fourth resistance levels L1, L2, L3 and L4 in that order.

Hereinafter, a memory system according to another embodiment of the present inventive concept will be described.

Figure 24:
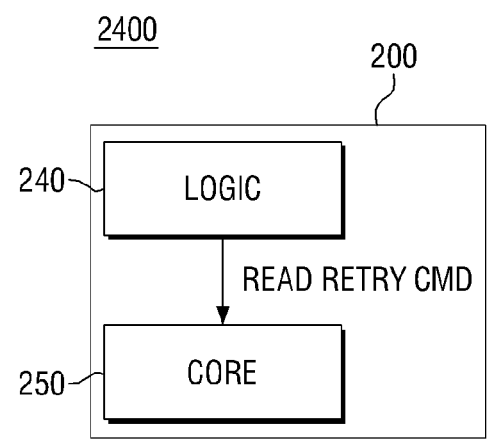
FIG. 24 is a partial block diagram of a memory system according to another embodiment of the present inventive concept.

FIG. 24 is a partial block diagram of a memory system according to another embodiment of the present inventive concept. For sake of convenient explanation, substantially the same content as that of memory system 400 according to the previous embodiment will not be given.

Referring to FIG. 24, memory system 2400 according to another embodiment of the present inventive concept includes a logic unit 240 and a core unit 250, which are provided inside a memory device 200.

Logic unit 240 supplies a read retry operation signal indicated by READ RETRY CMD to core unit 250, and core unit 250 performs read/write operations.

Here, logic unit 240 may supply the read retry operation signal READ RETRY CMD to core unit 250 when a read fail bit value of greater than or equal to a preset critical value is generated during a read operation in memory device 200.

That is to say, unlike in memory system 400 according to the previous embodiment in which memory controller 100 supplies a read retry operation signal to memory device 200, in memory system 2400 according to another embodiment of the present inventive concept, a read retry operation is performed by internal operations of memory device 200.

Hereinafter, a method for driving a nonvolatile memory device according to an embodiment of the present inventive concept will be described.

Figure 25:
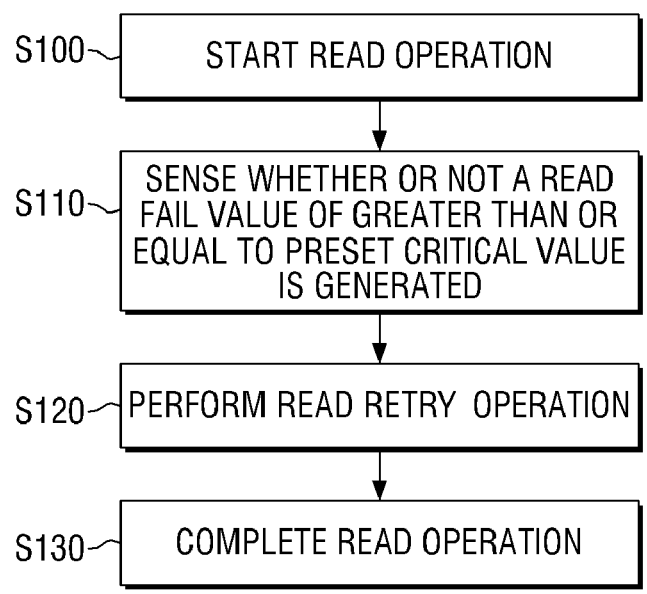
FIG. 25 is a flowchart sequentially illustrating a method for driving a nonvolatile memory device according to an embodiment of the present inventive concept.

FIG. 25 is a flowchart sequentially illustrating a method for driving a nonvolatile memory device according to an embodiment of the present inventive concept.

Referring to FIG. 25, first, the method for driving a nonvolatile memory device according to an embodiment of the present inventive concept may include starting a read operation (S100).

Then, it is sensed whether or not a read fail bit value of greater than or equal to a preset critical value is generated during a read operation of the data stored in a plurality of resistive memory cells (S110).

When the read fail bit value is greater than or equal to the preset critical value, a read retry operation is performed (S120).

Here, the read retry operation may be performed in various manners.

First, the read retry operation may be performed after changing a current flowing in a plurality of resistive memory cells by changing a difference between voltages of opposite ends of each of the plurality of resistive memory cells.

Second, the read retry operation may be performed by fixing a current flowing in a plurality of resistive memory cells by fixing voltages of opposite ends of each of the plurality of resistive memory cells.

Third, the read retry operation may be performed by changing voltages of opposite ends of each of a plurality of resistive memory cells by changing a current flowing in the plurality of resistive memory cells.

Fourth, the read retry operation may be performed after by fixing a current flowing in a plurality of resistive memory cells by fixing voltages of opposite ends of each of the plurality of resistive memory cells and changing the capacitance of a capacitor.

Fifth, the read retry operation may be performed after by fixing a current flowing in a plurality of resistive memory cells by fixing voltages of opposite ends of each of the plurality of resistive memory cells and changing a reference voltage level.

Sixth, the read retry operation may be performed after by fixing a current flowing in a plurality of resistive memory cells by fixing voltages of opposite ends of each of the plurality of resistive memory cells and changing a sensing time from a starting time point of discharging a plurality of capacitors respectively coupled to the plurality of resistive memory cells to a time point of reading the data stored in the plurality of resistive memory cells.

After the read retry operation is performed, the read operation is completed (S130).

Hereinafter, application examples of memory systems according to some embodiments of the present inventive concept will be described.

Figure 26:
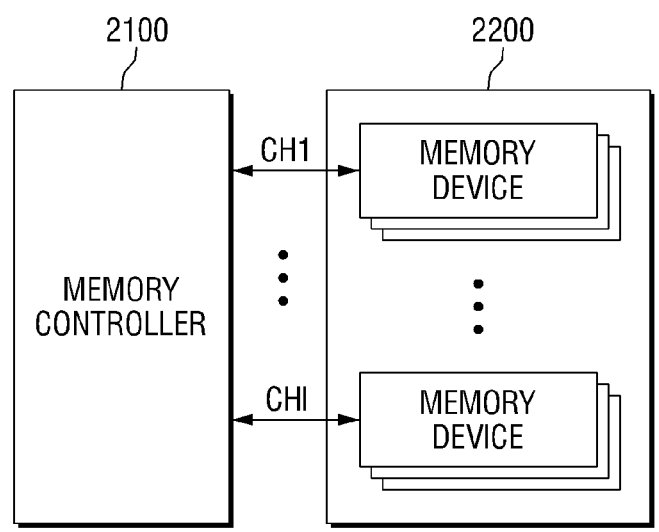
FIG. 26 is a block diagram for explaining an application example of the memory system shown in FIG. 4.

FIG. 26 is a block diagram for explaining an application example of the memory system shown in FIG. 4. For the sake of convenient explanation, the following description will focus on differences between the memory systems shown in FIGS. 4 and 26.

Referring to FIG. 26, memory system 2000 as the application example of the memory system shown in FIG. 4 includes a memory controller 2100 and a memory device 2200.

Memory device 2200 may include a plurality of memory chips. The plurality of memory chips may be divided into a plurality of groups. The respective groups of the plurality of memory chips may interface with memory controller 2100 through a common channel. For example, the respective groups of the plurality of memory chips may interface with memory controller 2100 through first to lth channels CH1 to CHl.

In memory system 2000 shown in FIG. 26, the plurality of memory chips may be configured in substantially the same manner with memory device 200 shown in FIG. 4. The plurality of memory chips may perform a first program of a main program operation using multiple pieces of back-up page data stored in a page buffer.

While a plurality of memory chips connected to one channel is exemplified in FIG. 26, one memory chip may be connected to one channel.

For example, memory systems 400 and 2000 shown in FIGS. 4 and 26 may be implemented as a computer, an ultra mobile personal computer (UMPC), a work station, a net-book, a personal digital assistant (PDA), a portable computer, a web tablet, a wireless phone, a mobile phone, a smart phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, a digital video player, a device capable of transmitting/receiving information in wireless environments, one of various electronic devices constituting a home network, one of various electronic devices constituting a computer network, one of various electronic devices constituting a telematics network, RFID devices, or embedded computing systems.

Figure 27:
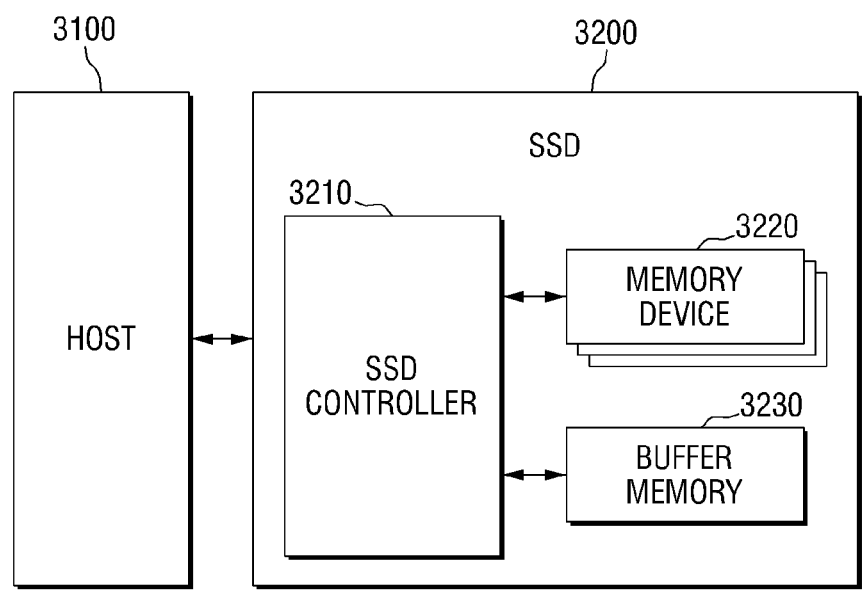
FIG. 27 is a block diagram for explaining a user system including a solid state drive.

FIG. 27 is a block diagram for explaining a user system 3000 including a solid state drive.

Referring to FIG. 27, user system 3000 includes a host 3100 and a solid state drive (SSD) 3200.

SSD 3200 includes an SSD controller 3210, a memory device 3220 and a buffer memory 3230.

SSD controller 3210 may be configured to interface with host 3100. SSD controller 3210 may access memory device 3220 in response to a request from host 3100. SSD controller 3210 may transfer data received from host 3100 to buffer memory 3230.

Memory device 3220 may be provided as a storage medium of SSD 3200. Memory device 3220 may include a plurality of memory chips. Each of the plurality of memory chips may be configured in substantially the same manner as memory device 200 shown in FIG. 4. The plurality of memory chips may perform a first program of a main program operation using multiple pieces of back-up page data stored in a page buffer.

Buffer memory 3230 may temporarily store data received from SSD controller 3210. During a program operation of memory device 3220, buffer memory 3230 may transfer the temporarily stored data to memory device 3220.

Buffer memory 3230 positioned outside SSD controller 3210 is illustrated in FIG. 27, but aspects of the present inventive concept are not limited thereto. Buffer memory 3230 may be provided as an internal component of SSD controller 3210.

Figure 28:
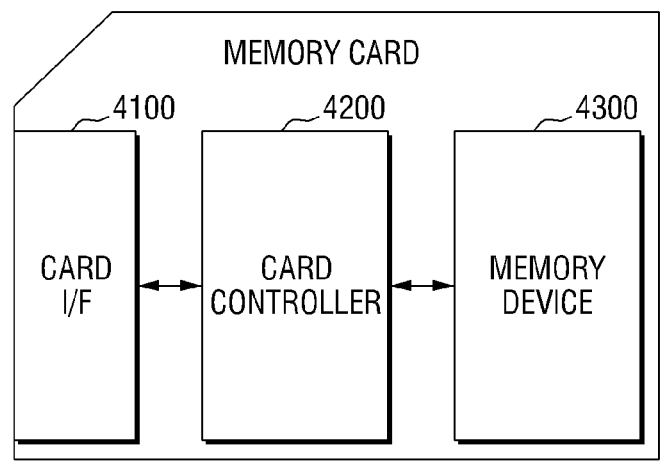
FIG. 28 is a block diagram for explaining a memory card including a nonvolatile memory device according to the present inventive concept.

FIG. 28 is a block diagram for explaining a memory card 4000 including a nonvolatile memory device according to the present inventive concept.

Referring to FIG. 28, memory card 4000 includes a card I/F 4100, a card controller 4200, and a memory device 4300.

Card I/F 4100, including a plurality of pins, may interface with a host. The plurality of pins may include command pins, data pins, clock pins, power pins, and so on, but aspects of the present inventive concept are not limited thereto. The number of pins may vary in various manners according to the kind of memory card 4000.

Card controller 4200 may be configured to write data to memory device 4300 or to read data from memory device 4300 in response to a request from the host.

Memory device 4300 may be configured in substantially the same manner as memory device 200 shown in FIG. 4. Memory device 4300 may perform a first program of a main program operation using multiple pieces of back-up page data stored in a page buffer.

Examples of memory card 4000 may include a PC card such as a personal computer memory card international association (PCMCIA) card, a compact flash (CF) card, a smart media card (e.g., SM or SMC), a memory stick, a multimedia card (e.g., MMC, RS-MMC or MMCmicro), a SD card (e.g., SD, miniSD, microSD and SDHC), or a universal flash storage (UFS).

Figure 29:
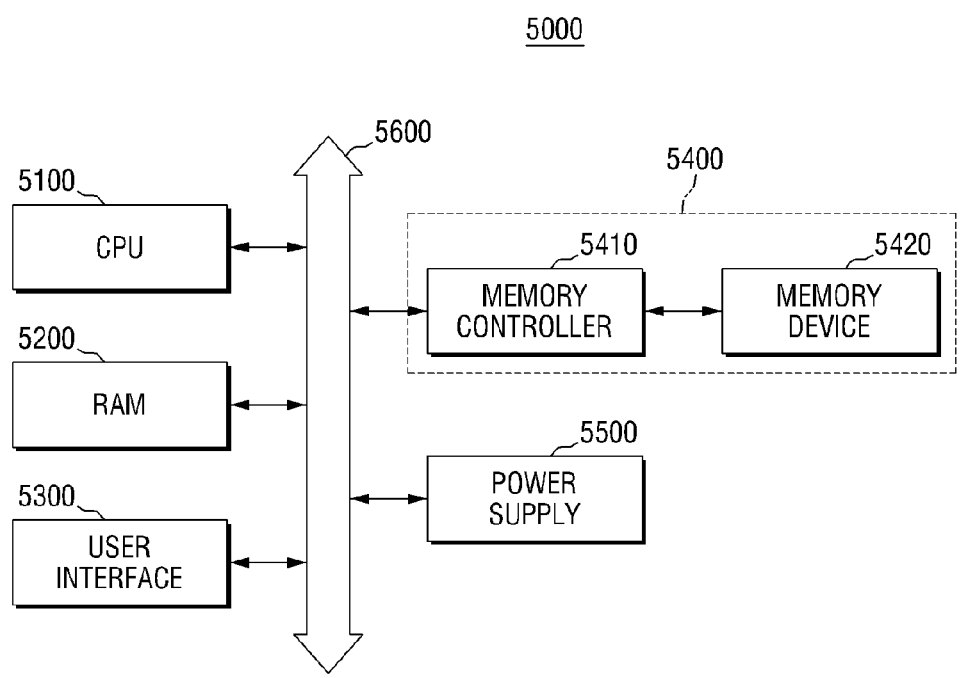
FIG. 29 is a block diagram for explaining a computing system including a nonvolatile memory device according to the present inventive concept.

FIG. 29 is a block diagram for explaining a computing system 5000 including a nonvolatile memory device according to the present inventive concept.

Referring to FIG. 29, computing system 5000 include a central processing unit (CPU) 5100, a random access memory (RAM) 5200, a user interface 5300, a memory system 5400 and a power supply 5500.

Memory system 5400 may be connected to CPU 5100, RAM 5200, user interface 5300 and a power supply 5500 through memory system 5400.

Memory system 5400 may be configured in substantially the same manner as memory device 200 shown in FIG. 4. Memory system 5400 may also be configured in substantially the same manner as memory system 2000 shown in FIG. 26. The data provided through user interface 5300 or processed by CPU 5100 may be stored in memory system 5400.

Memory device 5420 connected to a system bus 5600 through memory controller 5410 is illustrated in FIG. 29, but aspects of the present inventive concept are not limited thereto. In a modified embodiment, memory device 5420 may be directly connected to system bus 5600.

Meanwhile, computing system 5000 may be configured to include both memory systems 400 and 2000 shown in FIGS. 4 and 26.

The steps of the method or algorithm described above in connection with the embodiments of the present inventive concept may be embodied directly in hardware, in a software module executed by a processor, or in a combination of the two. A software module may reside in a random access memory (RAM), a flash memory, a read-only memory (ROM), an erasable programmable read-only memory (EPROM), an electrically erasable programmable read-only memory (EEPROM), a register, a hard disk, a removable disk, a compact disk read-only memory (CD-ROM), or any other form of storage medium known in the art. An exemplary storage medium may be coupled to the processor, such that the processor can read information from, and write information to, the storage medium. Alternatively, the storage medium may be integral to the processor. Further, in some aspects, the processor and the storage medium may reside in an ASIC. Additionally, the ASIC may reside in a user terminal. The processor and the storage medium may reside as discrete components in a user terminal.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A nonvolatile memory device comprising:
   a resistive memory cell;
   a sensing node; and
   a sense amplifier connected to the sensing node and configured to sense one of: a difference between a voltage level of the sensing node and a reference voltage level; and a difference between a current level of the sensing node and a reference current level,
   wherein when a read fail bit value is generated during a read operation of data stored in the resistive memory cell, a current flowing in the resistive memory cell is changed relative to a current flowing in the resistive memory cell during the read operation by changing a difference between voltages of opposite ends of the resistive memory cell, and a read retry operation is then performed while the changed current is flowing in the resistive memory cell.

2. The nonvolatile memory device of claim 1, further comprising a first clamping unit connected between the resistive memory cell and the sensing node and configured to supply a first clamping bias to the resistive memory cell.

3. The nonvolatile memory device of claim 2, wherein the difference in the voltages of the opposite ends of the resistive memory cell is changed by changing the first clamping bias.

4. The nonvolatile memory device of claim 1, wherein the read retry operation is performed by fixing the current flowing in the resistive memory cell by fixing the voltages of the opposite ends of the resistive memory cell, and changing the reference current level.

5. The nonvolatile memory device of claim 1, wherein the read retry operation is performed after changing the current flowing in the resistive memory cell by changing the voltages of the opposite ends of the resistive memory cell.

6. The nonvolatile memory device of claim 1, further comprising:
   a capacitor connected to the sensing node and to the sense amplifier; and
   a clamping unit connected between the resistive cell and the sensing node and supplying a clamping bias to the resistive memory cell.

7. The nonvolatile memory device of claim 6, wherein the read retry operation is performed by fixing the current flowing in the resistive memory cell by fixing the voltages of the opposite ends of the resistive memory cell and changing the capacitance of the capacitor.

8. The nonvolatile memory device of claim 6, wherein the read retry operation is performed by fixing the current flowing in the resistive memory cell by fixing the voltages of the opposite ends of the resistive memory cell and changing the reference voltage level.

9. The nonvolatile memory device of claim 6, wherein the read retry operation is performed by: fixing the current flowing in the resistive memory cell by fixing the voltages of the opposite ends of the resistive memory cell and changing a sensing time from a starting time point of discharging the capacitor to a time point of reading the data stored in the resistive memory cell.

10. The nonvolatile memory device of claim 6, wherein the difference in the voltages of the opposite ends of the resistive memory cell is changed by changing the clamping bias.

11. The nonvolatile memory device of claim 1, wherein the resistive memory cell stores multiple bits.

12. The nonvolatile memory device of claim 1, wherein the resistive memory cell is a phase change random access memory (PRAM) or a resistive RAM (ReRAM).

13. A nonvolatile memory device, comprising:
   a memory cell array including a plurality of resistive memory cells;
   first to nth sensing nodes connected to the plurality of resistive memory cells, respectively; and
   sense amplifiers connected to the first to nth sensing nodes and configured to sense one of: a difference between each of voltage levels of the first to nth sensing nodes and a reference voltage level; and a difference between each of current levels of the first to nth sensing nodes and a reference current level,
   wherein n is a natural number of 2 or greater, and wherein when a read fail bit value of greater than or equal to a preset critical value is generated during a read operation of data stored in each of the plurality of resistive memory cells, a current flowing in each of the plurality of resistive memory cells is changed relative to a current flowing in each of the plurality of resistive memory cells during the read operation by changing a difference between voltages of opposite ends of each of the plurality of resistive memory cells, and a read retry operation is then performed while the changed current is flowing in each of the plurality of resistive memory cells.

14. The nonvolatile memory device of claim 13, wherein the read retry operation is performed by fixing the current flowing in each of the plurality of resistive memory cells by fixing the voltages of the opposite ends of each of the plurality of resistive memory cells and changing the reference current level.

15. The nonvolatile memory device of claim 13, wherein the read retry operation is performed after changing the voltages of the opposite ends of each of the plurality of resistive memory cells by changing the current flowing in each of the plurality of resistive memory cells.

16. The nonvolatile memory device of claim 13, further comprising a plurality of capacitors connected to the first to nth sensing nodes, respectively, and connected to the sense amplifiers.

17. The nonvolatile memory device of claim 16, wherein the read retry operation is performed by fixing the current flowing in each of the plurality of resistive memory cells by fixing the voltages of the opposite ends of each of the plurality of resistive memory cells and changing the capacitance of each of the plurality of capacitors.

18. The nonvolatile memory device of claim 16, wherein the read retry operation is performed by fixing the current flowing in each of the plurality of resistive memory cells by fixing the voltages of the opposite ends of each of the plurality of resistive memory cells and changing the reference voltage level.

19. The nonvolatile memory device of claim 16, wherein the read retry operation is performed by fixing the current flowing in each of the plurality of resistive memory cells by fixing the voltages of the opposite ends of each of the plurality of resistive memory cells and changing a sensing time from a starting time point of discharging the capacitor to a time point of reading the data stored in the plurality of resistive memory cells.

20. A memory system, comprising:
a resistive memory device;
a core unit positioned inside the resistive memory device and controlling read/write operations to be performed; and
a logic unit supplying a read retry operation signal to the core unit,
wherein the logic unit supplies the read retry operation signal when a read fail bit value which is greater than or equal to a preset critical value is generated during a read operation of a resistive memory cell of the resistive memory device.

* * * * *